US010978545B2

(12) United States Patent
Yang et al.

(10) Patent No.: US 10,978,545 B2
(45) Date of Patent: Apr. 13, 2021

(54) DISPLAY SUBSTRATE AND MANUFACTURING THEREOF, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Huijuan Yang, Beijing (CN); Tingliang Liu, Beijing (CN); Xiangdan Dong, Beijing (CN); Youngyik Ko, Beijing (CN); Jingyi Feng, Beijing (CN); Mengmeng Du, Beijing (CN)

(73) Assignees: CHENGDU BOE OPTOELECTRONICS TECHNOLOGY CO., LTD, Sichuan Province (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/435,900

(22) Filed: Jun. 10, 2019

(65) Prior Publication Data
US 2020/0066825 A1 Feb. 27, 2020

(30) Foreign Application Priority Data
Aug. 27, 2018 (CN) .......................... 201810982568.6

(51) Int. Cl.
*H01L 27/32* (2006.01)
*H01L 27/12* (2006.01)

(52) U.S. Cl.
CPC ...... *H01L 27/3279* (2013.01); *H01L 27/3272* (2013.01); *H01L 27/3234* (2013.01); *H01L 2227/323* (2013.01)

(58) Field of Classification Search
CPC ........................ H01L 27/3279; H01L 27/3234
See application file for complete search history.

(56) References Cited

U.S. PATENT DOCUMENTS 10,446,800 B2 * 10/2019 Shedletsky ......... H01L 51/5271
2003/0146710 A1 * 8/2003 Nakanishi ........... H01L 27/3244
315/169.3

(Continued)

FOREIGN PATENT DOCUMENTS

CN 104332477 A 2/2015
CN 104881170 A 9/2015

(Continued)

OTHER PUBLICATIONS

First office action of Chinese application No. 201810982568.6 dated Mar. 16, 2020.

(Continued)

*Primary Examiner* — Moazzam Hossain
(74) *Attorney, Agent, or Firm* — Fay Sharpe LLP

(57) ABSTRACT

Provided are a display substrate and a manufacturing method thereof, and a display device. The display substrate includes: a base substrate, and a conductive layer, an intermediate insulating layer, and a metal layer that are sequentially laminated on the base substrate. The conductive layer includes a first conductive pattern and a second conductive pattern at an interval; the intermediate insulating layer has a first via-hole and a second via-hole; and the metal layer includes a first signal line and a second signal line at an interval, wherein the first signal line is connected to the first conductive pattern through the first via-hole, and the second signal line is connected to the second conductive pattern through the second via-hole. Since the conductive pattern (Continued)

connected to the signal line is capable of effectively reducing the resistance of the signal line, the display effect of the display device is improved.

19 Claims, 13 Drawing Sheets

(56) References Cited

U.S. PATENT DOCUMENTS

| | | | | |
|---|---|---|---|---|
| 2004/0081751 | A1* | 4/2004 | Nakanishi | H01L 27/3276 427/108 |
| 2005/0116621 | A1* | 6/2005 | Bellmann | B41M 5/38207 313/503 |
| 2009/0009068 | A1* | 1/2009 | Fujimura | H01L 51/5221 313/504 |
| 2011/0101353 | A1* | 5/2011 | Park | H01L 29/78633 257/59 |
| 2012/0256089 | A1* | 10/2012 | Kanda | G06K 9/0004 250/338.1 |
| 2014/0183342 | A1 | 7/2014 | Shedletsky et al. | |
| 2016/0071891 | A1 | 3/2016 | Oh et al. | |
| 2016/0103359 | A1* | 4/2016 | Kimura | G02F 1/133602 349/33 |
| 2016/0141425 | A1 | 5/2016 | Sun et al. | |
| 2017/0059930 | A1* | 3/2017 | Wu | G02B 5/201 |
| 2017/0161543 | A1* | 6/2017 | Smith | G06K 9/00013 |
| 2017/0309242 | A1 | 10/2017 | Kim et al. | |
| 2019/0393295 | A1* | 12/2019 | Moy | H01L 27/3276 |

FOREIGN PATENT DOCUMENTS

| | | |
|---|---|---|
| CN | 107121852 A | 9/2017 |
| CN | 107305306 A | 10/2017 |

OTHER PUBLICATIONS

Second office action of Chinese application No. 201810982568.6 dated Oct. 21, 2020.

* cited by examiner

DISPLAY SUBSTRATE AND MANUFACTURING THEREOF, AND DISPLAY DEVICE

This application claims priority to Chinese Patent Application No. 201810982568.6, filed on Aug. 27, 2018 and entitled "DISPLAY SUBSTRATE, AND MANUFACTURING METHOD THEREOF, AND DISPLAY DEVICE", the entire contents of which are incorporated herein by reference.

TECHNICAL FIELD

The present disclosure relates to the field of display technology, and in particular, to a display substrate, and a manufacturing method thereof, and a display device.

BACKGROUND

In order to realize the narrow frame design of the display device, it is generally needs to reduce the size of the non-display area of the display substrate in the display device.

In the related art, a plurality of signal lines is provided in the non-display area of the display substrate and may be configured to supply power source signals to a pixel unit in the display area. For example, the plurality of signal lines may include a VDD signal line configured supply a high level and a VSS signal line configured supply a low level.

SUMMARY

Embodiments of the present disclosure provide a display substrate, and a manufacturing method thereof, and a display device. The technical solutions are as follows.

In an aspect, there is provided a display substrate, comprising: a base substrate, and a conductive layer, an intermediate insulating layer, and a metal layer that are sequentially laminated on the base substrate; wherein
the conductive layer comprises a first conductive pattern and a second conductive pattern at an interval;
the intermediate insulating layer has a first via-hole and a second via-hole; and
the metal layer comprises a first signal line and a second signal line at an interval, wherein the first signal line is connected to the first conductive pattern through the first via-hole, and the second signal line is connected to the second conductive pattern through the second via-hole.

Optionally, the display substrate comprises a display area and a non-display area, wherein the first conductive pattern, the second conductive pattern, the first via-hole, the second via-hole, the first signal line, and the second signal line are all in the non-display area.

Optionally, the conductive layer further comprises a third conductive pattern in the display area, and the third conductive pattern and the second conductive pattern are an integral structure.

Optionally, the conductive layer is a light-shielding layer made of a conductive and light-shielding material, and the conductive layer, the intermediate insulating layer and the metal layer are sequentially laminated in a direction away from the base substrate.

Optionally, the display substrate further comprises: at least one optical sensor on a side of the base substrate away from the conductive layer, wherein the conductive layer has at least one through-hole, and an orthographic projection of each through-hole on the base substrate overlaps with an orthographic projection of one optical sensor on the base substrate.

Optionally, the display substrate further comprises: a plurality of light-emitting units on a side of the metal layer away from the base substrate, wherein the plurality of light-emitting units, the at least one optical sensor, and the at least one through-holes are all in the display area of the display substrate, and the orthographic projection of each through-hole on the base substrate does not overlap with an orthographic projection of each light-emitting unit on the base substrate.

Optionally, the first signal line is in the non-display area; the display substrate further comprises: an overlapping electrode on a side of the metal layer away from the base substrate, wherein the overlapping electrode is in the non-display area and is disposed in a same layer as a first electrode block in the light-emitting unit of the display substrate; and the overlapping electrode is in contact with the first signal line and a second electrode layer of the light-emitting unit, respectively.

Optionally, the display substrate further comprises: a flat layer between the metal layer and the light-emitting unit; wherein an orthographic projection of the flat layer on the base substrate does not overlap with an orthographic projection of the first signal line on the base substrate.

Optionally, the intermediate insulating layer has a plurality of the first via-holes and a plurality of the second via-holes; the first signal line is connected to the first conductive pattern through the plurality of the first via-holes; and the second signal line is connected to the first conductive pattern through the plurality of the second via-holes.

Optionally, the metal layer comprises two first signal lines that are disposed facing each other on two sides of the display area of the display substrate.

Optionally, the metal layer further comprises a plurality of source/drain metal patterns in the display area of the display substrate.

Optionally, the second conductive pattern is an annular pattern surrounding the display area of the display substrate, and the first conductive pattern is a strip pattern and the first conductive pattern is on a side of the second conductive pattern away from the display area.

In another aspect, there is provided a method for manufacturing a display substrate, comprising:
forming a conductive layer on a base substrate with a conductive material, wherein the conductive layer comprises a first conductive pattern and a second conductive pattern that are formed at an interval;
forming an intermediate insulating layer on the base substrate, wherein a first via-hole and a second via-hole are formed in the intermediate insulating layer; and
forming a metal layer on the base substrate, wherein the metal layer comprises a first signal line and a second signal line that are formed at an interval, wherein the first signal line is connected to the first conductive pattern through the first via-hole, and the second signal line is connected to the second conductive pattern through the second via-hole.

Optionally, the display substrate comprises a display area and a non-display area; and the first conductive pattern, the second conductive pattern, the first via-hole, the second via-hole, the first signal line, and the second signal line are all in the non-display area.

Optionally, forming the conductive layer on the base substrate with the conductive material comprises: forming a conductive layer on the base substrate with a conductive and light-shielding material;

wherein the conductive layer, the intermediate insulating layer and the metal layer are sequentially laminated in a direction away from the base substrate.

Optionally, the conductive layer has at least one through-hole, and the method further comprises:

disposing at least one optical sensor on a side of the base substrate away from the conductive layer;

wherein an orthographic projection of each through-hole on the base substrate overlaps with an orthographic projection of one optical sensor on the base substrate.

Optionally, the first signal line is in the non-display area, and the method further comprises:

forming a first electrode layer on a side of the metal layer away from the base substrate, wherein the first electrode layer comprises an overlapping electrode that is in the non-display area and in contact with the first signal line, and a plurality of first electrode blocks that are formed at an interval in the display area;

forming a light-emitting layer in the display area on a side of the first electrode layer away from the base substrate; and forming a second electrode layer that covers the display area and the non-display area and is contact with the overlapping electrode, on a side of the light-emitting layer away from the base substrate.

Optionally, prior to forming the first electrode layer on a side of the metal layer away from the base substrate, the method further comprises:

forming a flat layer on a side of the metal layer away from the base substrate, wherein an orthographic projection of the flat layer on the base substrate does not overlap with an orthographic projection of the first signal line on the base substrate.

In yet another aspect, there is provided a display device, comprising the display substrate described in the above aspect.

BRIEF DESCRIPTION OF THE DRAWINGS

In order to describe the technical solutions in the embodiments of the present more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

The embodiments of the present disclosure will be described in further detail with reference to the accompanying drawings, to present the objects, technical solutions, and advantages of the present disclosure more clearly.

In the related art, the width of the signal line narrows after reducing the size of the non-display area of the display substrate, which may increase the resistance of the signal line and thereby affect the display effect of the display device.

Figure 1:
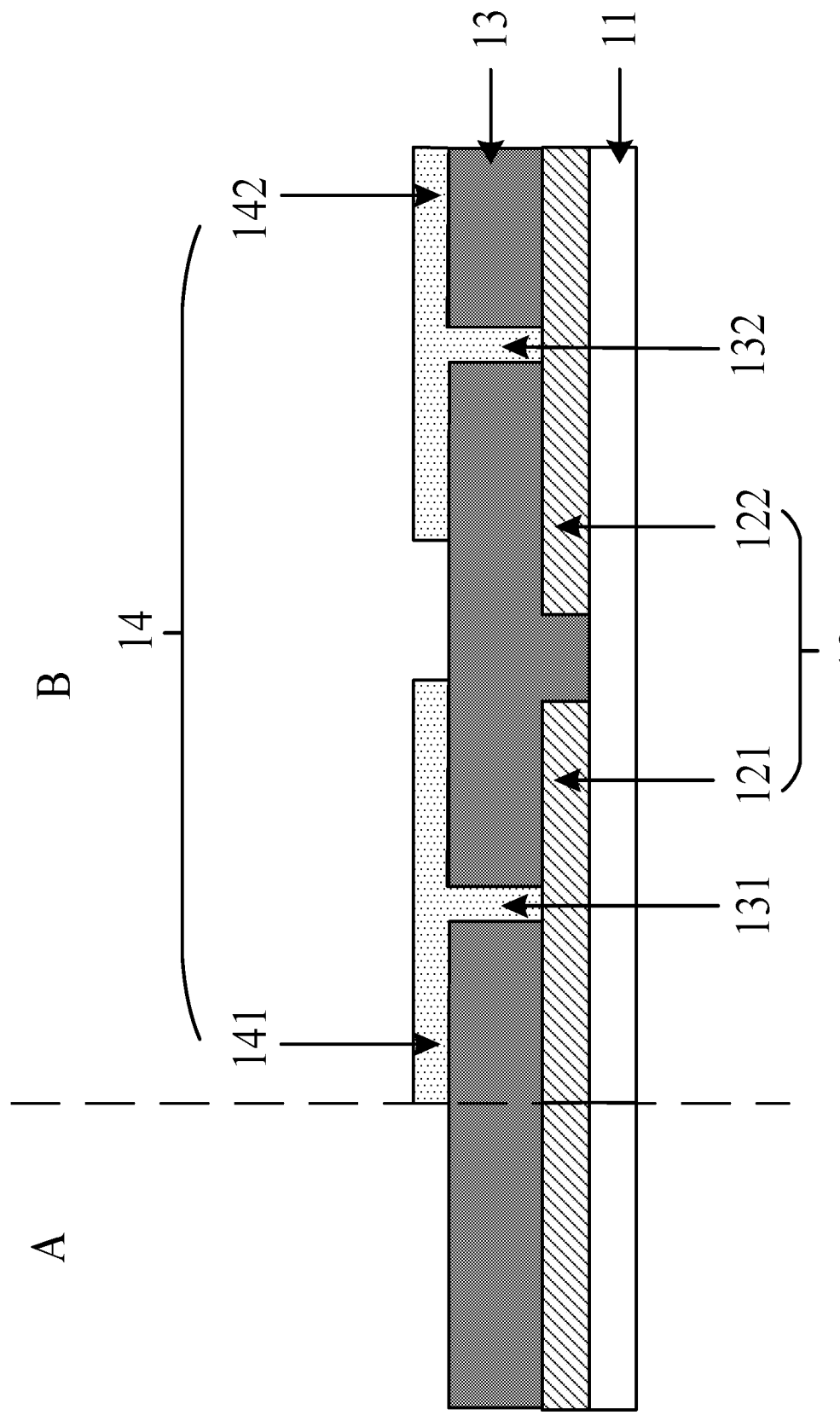
FIG. 1 is a schematic diagram of a structure of a display substrate according to an embodiment of the present disclosure.

An embodiment of the present disclosure provides a display substrate, which can solve the problem in the related art that the resistance of the signal line is relatively large. FIG. 1 is a schematic diagram of a structure of a display substrate according to an embodiment of the present disclosure. As shown in FIG. 1, the display substrate may include: a base substrate 11, and a conductive layer 12, an intermediate insulating layer 13, and a metal layer 14 that are sequentially laminated on the base substrate 11.

Here, the conductive layer 12 may be made of a conductive material, and may include a first conductive pattern 121 and a second conductive pattern 122 at an interval. That is, the first conductive pattern 121 and the second conductive pattern 122 are insulated from each other.

The intermediate insulating layer 13 is provided with a first via-hole 131 and a second via-hole 132. The metal layer 14 may include a first signal line 141 and a second signal line 142 at an interval. The first signal line 141 may be connected to the first conductive pattern 121 through the first via-hole 131, and the second signal line 142 is connected to the second conductive pattern 122 through the second via-hole 132.

Exemplarily, the first signal line 141 may be a VSS signal line configured to supply a low-level signal for the light-emitting unit in a display area A and a driving circuit in a non-display area B. The second signal line 142 may be a VDD signal line configured to supply a high-level signal for the light-emitting unit in the display area A. Alternatively, the first signal line 141 and the second signal line 142 may also be other types of signal lines in the display substrate, such as, gate lines, data lines or the like.

In summary, an embodiment of the present disclosure provides a display substrate. The first signal line in the display substrate may be connected to the first conductive pattern in the conductive layer through the first via-hole, and the second signal line may be connected to the second conductive pattern in the conductive layer through the second via-hole. Thus, each signal line is connected to a conductive structure in parallel, which reduces the resistance of the signal line, and correspondingly, improves the display effect of the display device.

It should be noted that, as shown in FIG. 1, the conductive layer 12, the intermediate insulating layer 13, and the metal layer 14 may be sequentially laminated in a direction away from the base substrate 11. Alternatively, the conductive layer 12, the intermediate insulating layer 13, and the metal layer 14 may be sequentially laminated in a direction close to the base substrate 11.

Optionally, referring to FIG. 1, the display substrate includes a display area A and a non-display area B. The display area A is also referred to as an active area (AA), and the non-display area B is an area around the display area A. Referring to FIG. 1, it can be seen that all of the first conductive pattern 121, the second conductive pattern 122, the first via-hole 131, the second via-hole 132, the first signal line 141, and the second signal line 142 may be in the non-display area B.

Here, the first signal line 141 and the second signal line 142 may both be power source signal lines. For example, the first signal line 141 may be a VSS signal line, and the second signal line 142 may be a VDD signal line.

Figure 2:
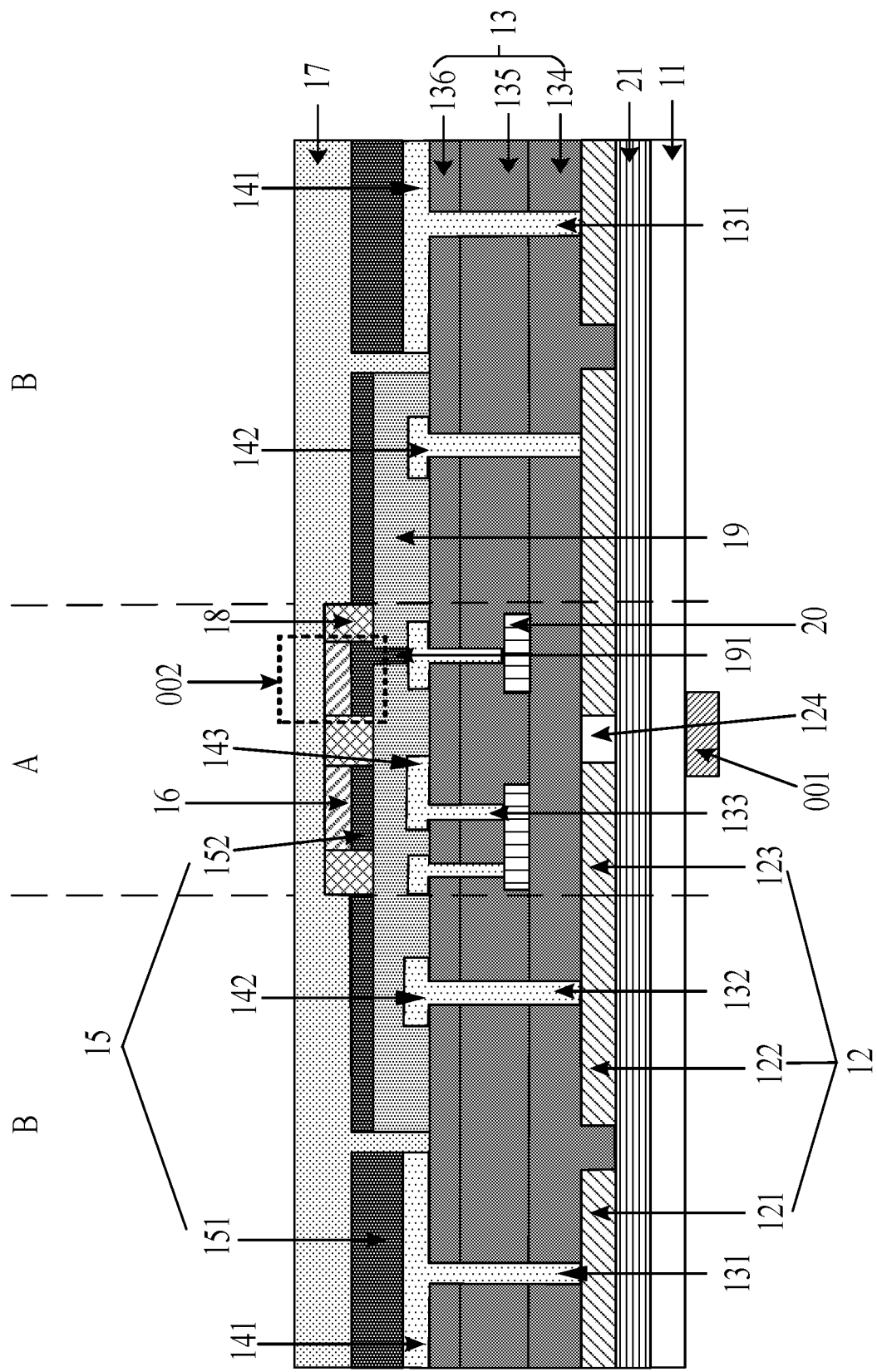
FIG. 2 is a schematic diagram of a structure of another display substrate according to an embodiment of the present disclosure.

FIG. 2 is a schematic diagram of a structure of another display substrate according to an embodiment of the present disclosure. As shown in FIG. 2, the conductive layer 12 may further include a third conductive pattern 123 in the display area A, and the third conductive pattern 123 and the second conductive pattern 122 may be an integral structure. During the process of manufacturing the display substrate, the third conductive pattern 123 and the second conductive pattern 122 may be manufactured by one patterning process.

By arranging the second conductive pattern 122 and the third conductive pattern 123 as an integral structure, it can ensure that the area of the conductive structure connected to the second signal line 142 is relatively large, thereby effectively reducing the resistance of the second signal line 142.

Optionally, the first conductive pattern 121, the second conductive pattern 122, and the third conductive pattern 123 may all be manufactured by one patterning process.

In the embodiment of the present disclosure, the conductive layer 12 may be a light-shielding layer made of a conductive and light-shielding material. When the conductive layer is a light-shielding layer, as shown in FIG. 1 and FIG. 2, the conductive layer 12, the intermediate insulating layer 13, and the metal layer 14 are sequentially laminated in a direction away from the base substrate 11.

By employing the light-shielding layer as a conductive layer, the resistance of the signal line can be effectively reduced without increasing the complexity of the manufacturing process and the manufacturing cost of the display substrate.

Optionally, as shown in FIG. 2, at least one optical sensor 001 may be disposed at a side of the base substrate 11 away from the conductive layer 12, and illustration is shown in FIG. 2 by taking one optical sensor as an example.

The conductive layer 12 has at least one through-hole 124, and an orthographic projection of each through-hole 124 on the base substrate 11 overlaps with an orthographic projection of one optical sensor 001 on the base substrate 11. As the conductive layer 12 is a light-shielding layer made of a light-shielding material, by forming the through-hole 124 in the conductive layer 12, the optical sensor 001 becomes photosensitive by the through-hole 124, thereby ensuring that the optical sensor 001 can operate normally.

Exemplarily, the optical sensor 001 may include at least one kind of sensor that needs to be photosensitive, such as a camera, an optical fingerprint sensor or the like.

Optionally, as shown in FIG. 2, the display substrate may further include a plurality of light-emitting units 002 at a side of the metal layer 14 away from the base substrate 11. The plurality of light-emitting units 002 and the at least one optical sensor 001 are all in the display area A.

The at least one through-hole 124 may be in the third conductive pattern 123 of the conductive layer 12. That is, the at least one through-hole 124 is also in the display area A. In addition, the orthographic projection of each through-hole 124 on the base substrate 11 does not overlap with the orthographic projection of each light-emitting unit 002 on the base substrate 11.

By enabling the orthographic projection of the light-emitting unit 002 to not overlap with that of the through-hole 124, the light transmitted through the through-hole 124 may be prevented from being shielded by the light-emitting unit 002, to ensure the normal operation of the optical sensor 001.

Exemplarily, the optical sensor 001 may be an optical fingerprint sensor, and the display substrate may include a plurality of optical fingerprint sensors. The third conductive pattern 123 may be provided with a plurality of through-holes 124 in a one-to-one correspondence with the plurality of optical fingerprint sensors, and the orthographic projection of each of the through-holes 124 on the base substrate 11 may overlap with the orthographic projection of the corresponding optical sensor 001 on the base substrate 11.

In the embodiment of the present disclosure, continuing to refer to FIG. 2, the display substrate may further include a first electrode layer 15, a light-emitting layer 16, and a second electrode layer 17 that are sequentially laminated at a side of the metal layer 14 away from the base substrate 11.

The first electrode layer 15 may include an overlapping electrode 151 that is disposed in the non-display area B and in contact with the first signal line 141, and a plurality of first electrode blocks 152 disposed at intervals in the display area A. Here, the overlapping electrode 151 and the plurality of first electrodes 152 may be made of an Indium tin oxide (ITO) material.

The light-emitting layer 16 is in the display area A. Optionally, the light-emitting layer 16 may be made of an organic light-emitting material. The second electrode layer 17 covers the display area A and the non-display area B, and is contact with the overlapping electrode 151. The second electrode layer 17 may be a sheet electrode block.

In the embodiment of the present disclosure, the first electrode block 152 may be an anode, the second signal line 142 may be connected to a driving transistor in each pixel circuit in the display area, and the driving transistor in each pixel circuit may be connected to one first electrode block 152. Thus, the second signal line 142 can transmit power source signals to each of the first electrode blocks 152 through the driving transistor. The level of the power source signals transmitted by the second signal line 142 may be a high level.

The second electrode layer 17 may be a cathode, and the first signal line 141 may transmit power source signals to the second electrode layer 17 through the overlapping electrode 151 in the first electrode layer 15. Exemplarily, the level of the power source signals transmitted by the first signal line 141 may be a low level.

In the embodiment of the present disclosure, the light-emitting layer 16 may include a plurality of light-emitting patterns disposed at intervals. The plurality of light-emitting patterns is disposed in an area defined by a pixel defining layer 18, respectively. For example, the plurality of light-emitting patterns may include red light-emitting patterns, green light-emitting patterns, and blue light-emitting patterns. Each of the light-emitting patterns may constitute a light-emitting unit 002 with one first electrode block 152 and the second electrode layer 17. The light-emitting unit 002 may be an oxide light-emitting diode (OLED) or an active-matrix organic light-emitting diode (AMOLED).

In the embodiment of the present disclosure, the orthographic projection of each first electrode block 152 on the base substrate 11 may overlap with the orthographic projection of one light-emitting pattern on the base substrate 11. The first signal line 141 transmits power source signals at a low level to the second electrode layer 17 through the overlapping electrode 151 in the first electrode layer 15. After the second signal line 142 provides the power source signals to each of the first electrode blocks 152 through the driving transistor, the second electrode layer 17 can drive the respective light-emitting pattern to emit light, together with each of the first electrode blocks 152.

Referring to FIG. 2, the display substrate may further include a flat layer 19 between the metal layer 14 and the light-emitting unit 002. The flat layer 19 covers the display area A and the second signal line 142 in the non-display area B, and the orthographic projection of the flat layer 19 on the base substrate 11 does not overlap with the orthographic projection of the first signal line 141 on the base substrate 11. That is, the flat layer 19 does not cover the first signal line 141. Thus, it ensures that the overlapping electrode 151 in the first electrode layer 15 can be in contact with the first signal line 141 when the first electrode layer 15 is formed at a side of the flat layer away from the base substrate 11.

Optionally, the flat layer 19 may be made of a resin material.

Figure 3:
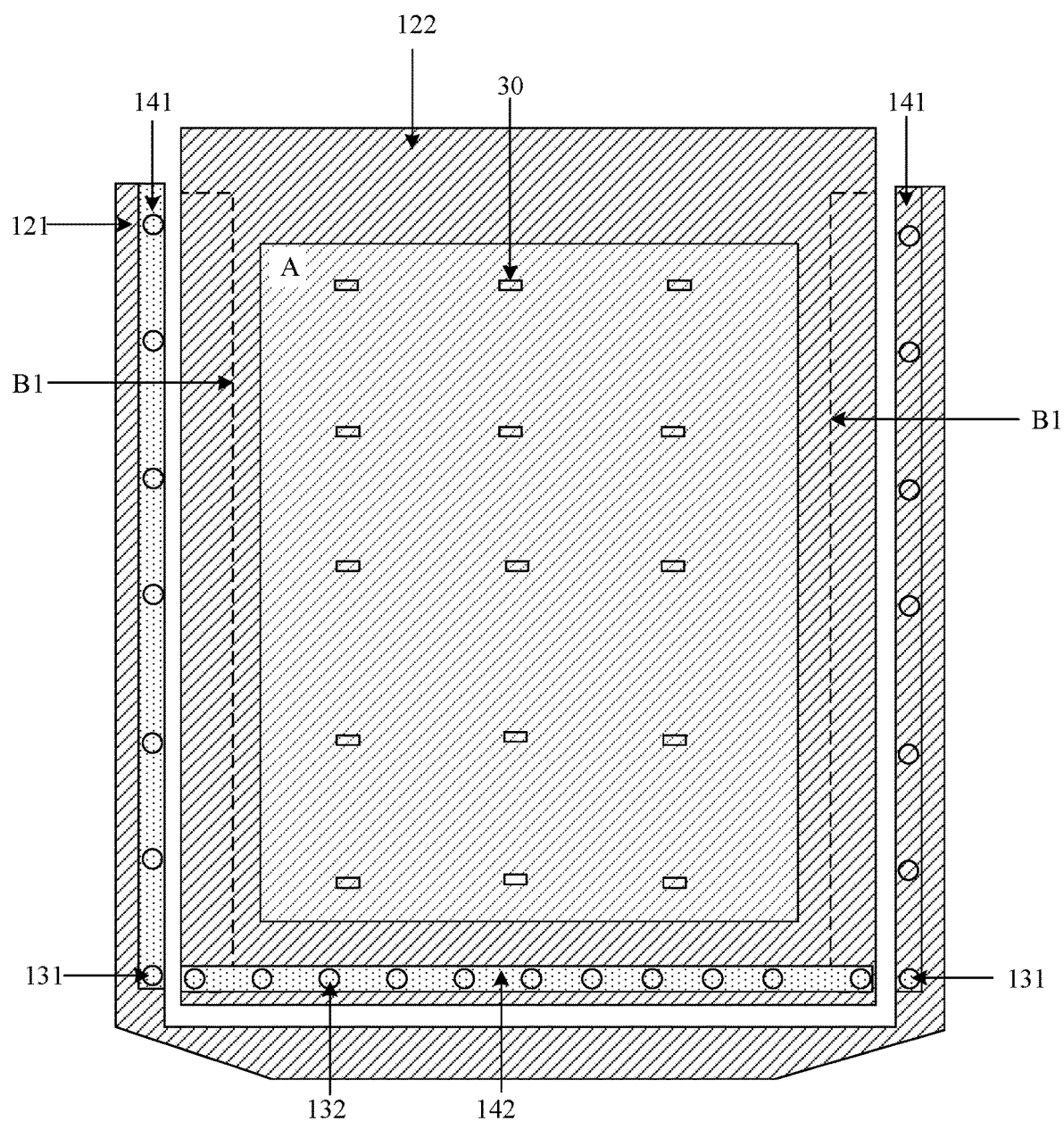
FIG. 3 is a top view of a display substrate according to an embodiment of the present disclosure.

FIG. 3 is a top view of a display substrate according to an embodiment of the present disclosure. Referring to FIG. 2 and FIG. 3, the portion of the metal layer 14 in the non-display area B may include two first signal lines 141 that may be disposed facing each other on two sides of the display area A.

Exemplarily, the two first signal lines 141 may be disposed in parallel and may be parallel to the data lines in the display substrate.

Optionally, a portion of the intermediate insulating layer 13 in the non-display area B may be provided with a plurality of first via-holes 131 and a plurality of second via-holes 132. The first signal lines 141 may be connected to the first conductive pattern 121 through the plurality of first via-holes 131. The second signal lines 142 may be connected to the second conductive pattern 122 through the plurality of second via-holes 132.

Exemplarily, as shown in FIG. 3, the portion of the intermediate insulating layer 13 in the non-display area B may be provided with two first via-hole groups, each of which includes a plurality of first via-holes 131 disposed at intervals. Each of the first signal lines 141 may be connected to the first conductive pattern 121 through one first via-hole group.

Here, the plurality of first via-holes 131 in each of the first via-hole groups may be arranged at equal intervals along the extending direction of the first signal line 141, and the distance between two adjacent first via-holes 131 may be 4 micrometers to 6 micrometers. The plurality of second via-holes 132 may be arranged at equal intervals along the extending direction of the first signal line 142, and the distance between two adjacent second via-holes 132 may also be 4 micrometers to 6 micrometers.

Referring to FIG. 2, the portion of the metal layer 14 in the display area A may further include a plurality of source/drain metal patterns 143, and each of the source/drain metal patterns 143 may include a source and a drain of a driving transistor. That is, the metal layer 14 may be a source/drain metal layer in the display substrate.

One of the source and drain in each of the source/drain metal patterns 143 may be connected to the corresponding first electrode block 152 through the third via-hole 191 in the flat layer 19 and further connected to the active layer 20 through the fourth via-hole 133 in the intermediate insulating layer 13. The other one of the source and drain in each of the source/drain metal patterns 143 may be connected to the second signal line 142. The second signal line 142 may transmit the power source signals at a high level to the corresponding first electrode block 152 through the source/drain metal patterns 143.

As an optional implementation, referring to FIG. 3, the second conductive pattern 122 may be an annular pattern surrounding the display area A. The first conductive pattern 121 may be a strip pattern, and the first conductive pattern 121 is at a side of the second conductive pattern 122 away from the display area A.

Exemplarily, the second conductive pattern 122 may be a rectangular annular pattern, and the first conductive pattern 121 may surround three sides of the rectangular annular pattern except for one side opposite to the binding area.

As another optional implementation, the second conductive pattern 122 may be an annular pattern surrounding the display area A, and the first conductive pattern 121 may be an annular pattern surrounding the second conductive pattern 122. For example, the two conductive patterns may both be of a rectangular annular structure.

In the embodiment of the present disclosure, as shown in FIG. 3, the non-display area B may include two gate driver on array (GOA) areas B1. The two GOA areas B1 are disposed facing each other on two sides of the display area A, and a part of the second via-holes 132 are in the GOA area.

Optionally, as shown in FIG. 2, the intermediate insulating layer 13 may include a buffer layer 134, a gate insulating layer 135, and an interlayer dielectric layer 136 that are sequentially laminated in a direction away from the base substrate 11. Here, the gate insulating layer 135 is disposed between the active layer 20 and the gate metal layer (not shown in the figure), and the interlayer dielectric layer 136 is disposed between the gate electrode layer and the metal layer 14.

Optionally, referring to FIG. 2, the display substrate may further include a polyimide (PI) film 21 on the base substrate 11.

In summary, the embodiment of the present disclosure provides a display substrate. The first signal line in the display substrate may be connected to the first conductive pattern in the conductive layer through the first via-hole, the second signal line may be connected to the second conductive pattern in the conductive layer through the second via-hole, and the conductive layer is made of a conductive material. Thus, each signal line is connected to a conductive structure in parallel, which reduces the resistance of the signal line, and correspondingly, improves the display effect of the display device.

Figure 4:
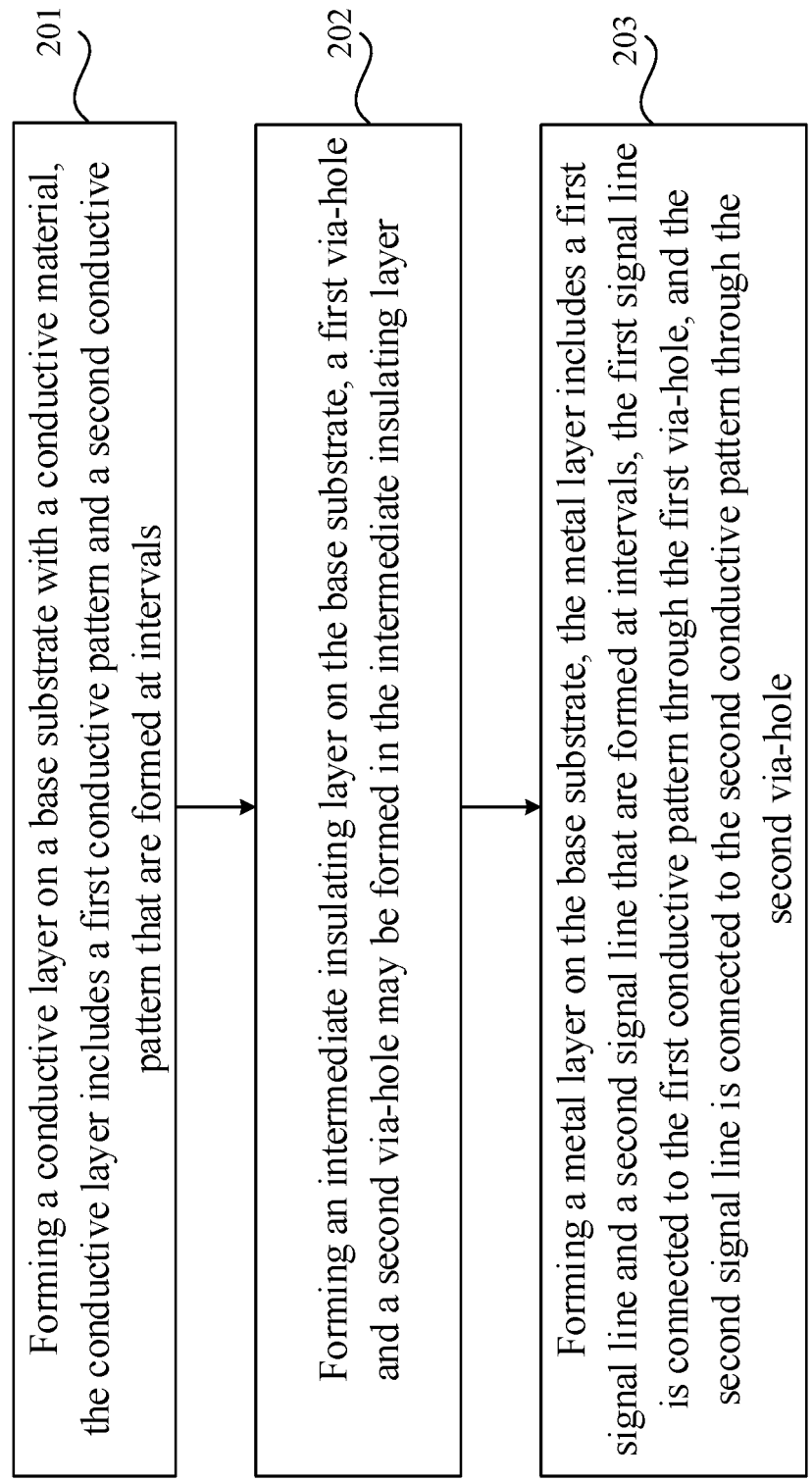
FIG. 4 is a flowchart of a method for manufacturing a display substrate according to an embodiment of the present disclosure.

FIG. 4 is a flowchart of a method for manufacturing a display substrate according to an embodiment of the present disclosure. The method may be used to manufacture the display substrate shown in FIG. 1. Referring to FIG. 4, the method may include following steps.

In step 201, a conductive layer is formed on a base substrate with a conductive material. The conductive layer includes a first conductive pattern and a second conductive pattern that are formed at an interval.

In the embodiment of the present disclosure, the conductive layer 12 may be formed on the base substrate 11 by one patterning process. Here, the patterning process may include steps of depositing a film layer with a magnetron sputtering process, photoresist coating, exposure, development, etching, and photoresist stripping, etc. Exemplarily, the conductive material may be a metal material, for example, molybdenum. The schematic diagram of the base substrate 11 on which the conductive layer 12 is formed may be made reference to FIG. 5.

In step 202, an intermediate insulating layer is formed on the base substrate. A first via-hole and a second via-hole may be formed in the intermediate insulating layer.

Figure 6:
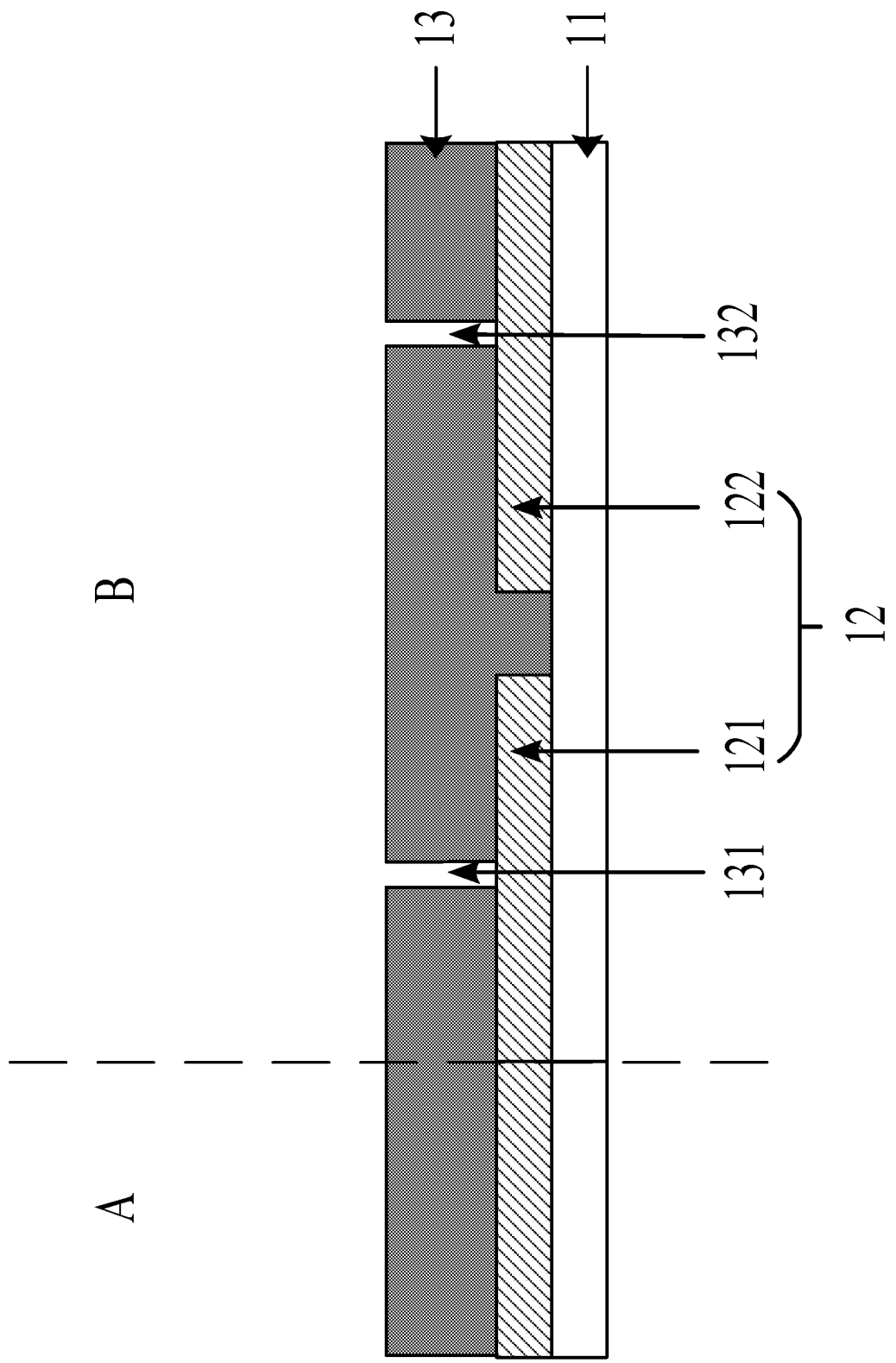
FIG. 6 is a schematic diagram of a base substrate formed with an intermediate insulating layer according to an embodiment of the present disclosure.

The intermediate insulating layer 13 may be formed on the side of the conductive layer 12 away from the base substrate 11 by a plurality of patterning processes. The schematic diagram of the base substrate 11 on which the intermediate insulating layer 13 is formed may be made reference to FIG. 6.

In step 203, a metal layer is formed on the base substrate. The metal layer includes a first signal line and a second signal line that are formed at an interval. The first signal line is connected to the first conductive pattern through the first via-hole, and the second signal line is connected to the second conductive pattern through the second via-hole.

Optionally, the material for forming the metal layer may include titanium and aluminum. For example, the metal layer may include titanium, aluminum, and titanium that are sequentially laminated. In addition, the metal layer may also be formed by one patterning process. Here, during the process of depositing the film layer in the patterning process, a layer of titanium may be deposited firstly, then a layer of aluminum may be deposited on the side of the titanium away from the base substrate 11, and finally a layer of titanium may be deposited on the side of the aluminum away from the base substrate 11. The schematic diagram of the base substrate 11 on which the metal layer 14 is formed may be made reference to FIG. 1.

It should be noted that the sequence for performing the respective steps of the method for manufacturing the display substrate may be adjusted according to situations. For example, steps 201 to 203 may be performed sequentially. Alternatively, the steps may be performed in the sequence of step 203, step 202, and step 201.

In summary, the embodiment of the present disclosure provides a method for manufacturing a display substrate. A conductive layer, an intermediate insulating layer and a metal layer that are laminated are sequentially formed on the base substrate with a conductive material. The first signal line in the metal layer may be connected to the first conductive pattern in the conductive layer through the first via-hole in the intermediate insulating layer, and the second signal line in the metal layer may be connected to the second conductive pattern in the conductive layer through the second via-hole in the intermediate insulating layer. Thus, each signal line is connected to a conductive structure in parallel, which reduces the resistance of the signal line, and correspondingly, improves the display effect of the display device.

Figure 7:
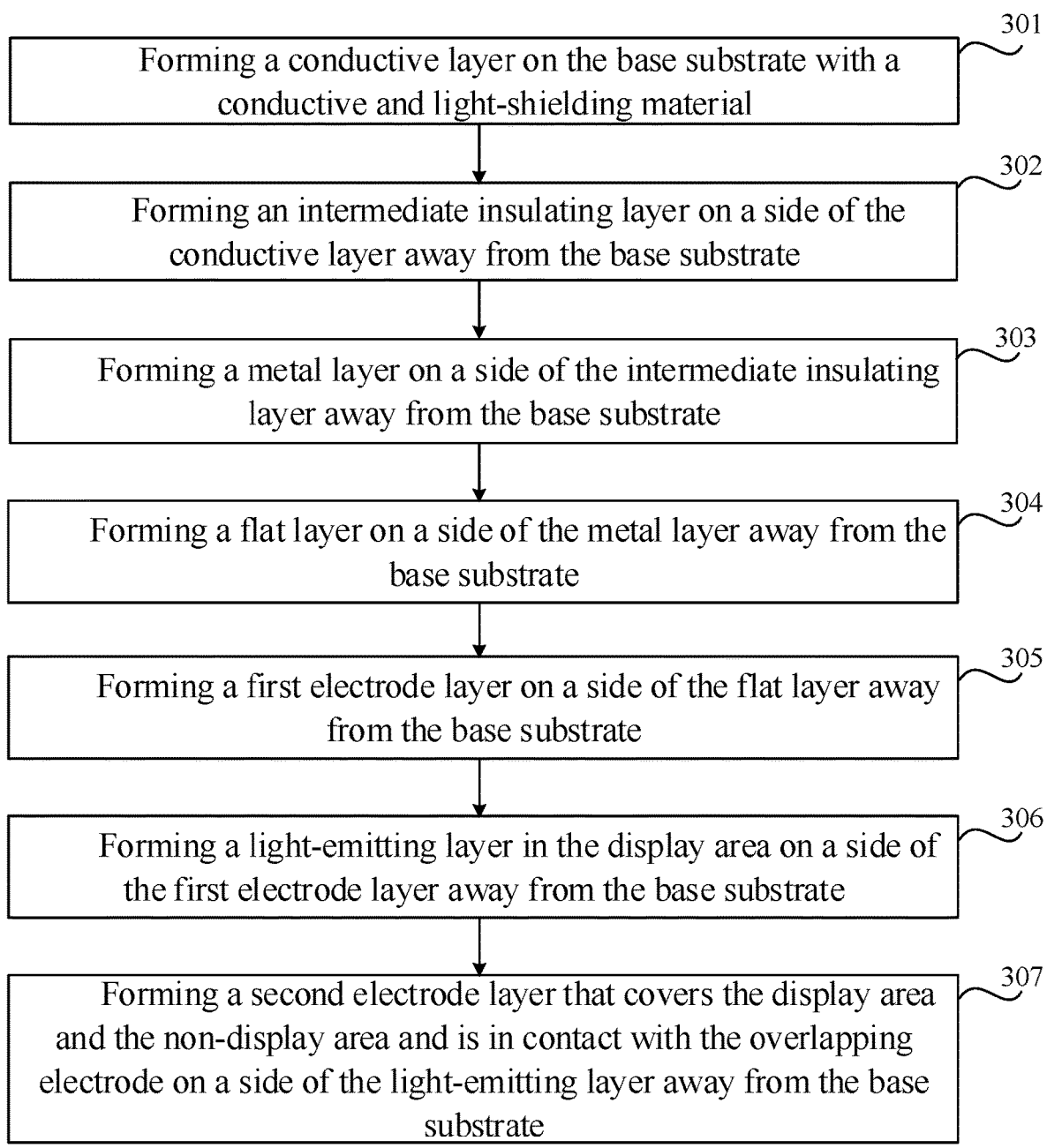
FIG. 7 is a flowchart of a method for manufacturing another display substrate according to an embodiment of the present disclosure.

FIG. 7 is a flowchart of a method for manufacturing another display substrate according to an embodiment of the present disclosure. The method may be used to manufacture the display substrate shown in FIG. 1 or FIG. 2. Referring to FIG. 7, the method may include following steps.

In step 301, a conductive layer is formed on the base substrate with a conductive and light-shielding material.

Figure 5:
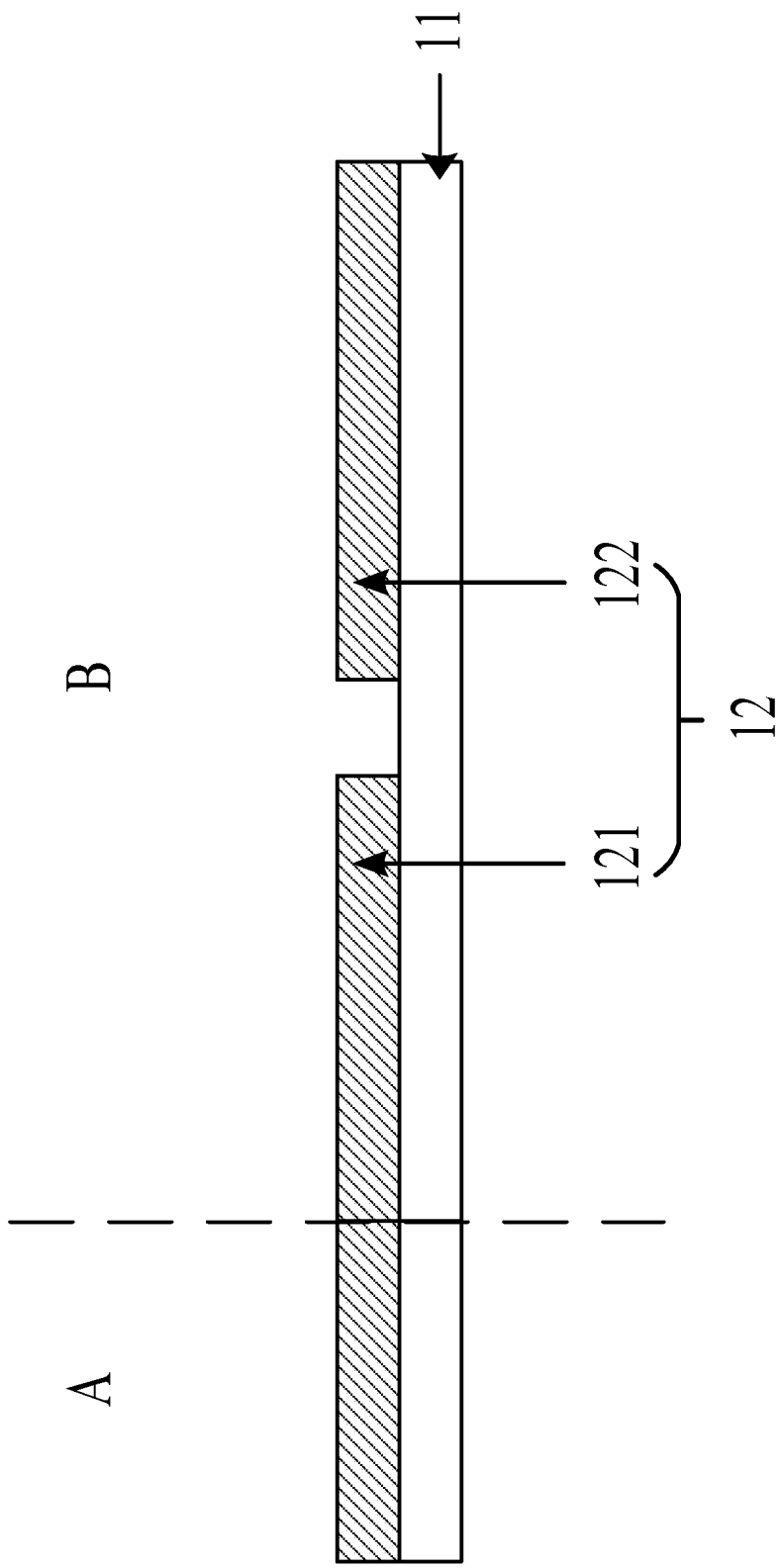
FIG. 5 is a schematic diagram of a base substrate formed with a conductive layer according to an embodiment of the present disclosure.

Referring to FIG. 5, a portion of the conductive layer 12 in the non-display area B may include a first conductive pattern 121 and a second conductive pattern 122 that are formed at an interval.

In the embodiment of the present disclosure, at least one optical sensor 001 may be disposed at the side of the base substrate 11 away from the conductive layer 12. At least one through-hole 124 may be formed in the conductive layer 12. The orthographic projection of each through-hole 124 on the base substrate 11 overlaps with the orthographic projection of one optical sensor 001 on the base substrate 11. By forming at least one through-hole 124 in the conductive layer 12, the optical sensor 001 becomes photosensitive by the through-hole 124, thereby ensuring the optical sensor 001 to operate normally.

Exemplarily, the at least one optical sensor may be optical fingerprint sensor in the display area A. The conductive layer 12 may further include a third conductive pattern 123 in the display area A, and the at least one through-hole 124 is formed in the third conductive pattern 123. In the embodiment of the present disclosure, the first conductive pattern 121, the second conductive pattern 122, and the third conductive pattern 123 may all be formed by one patterning process.

Figure 8:
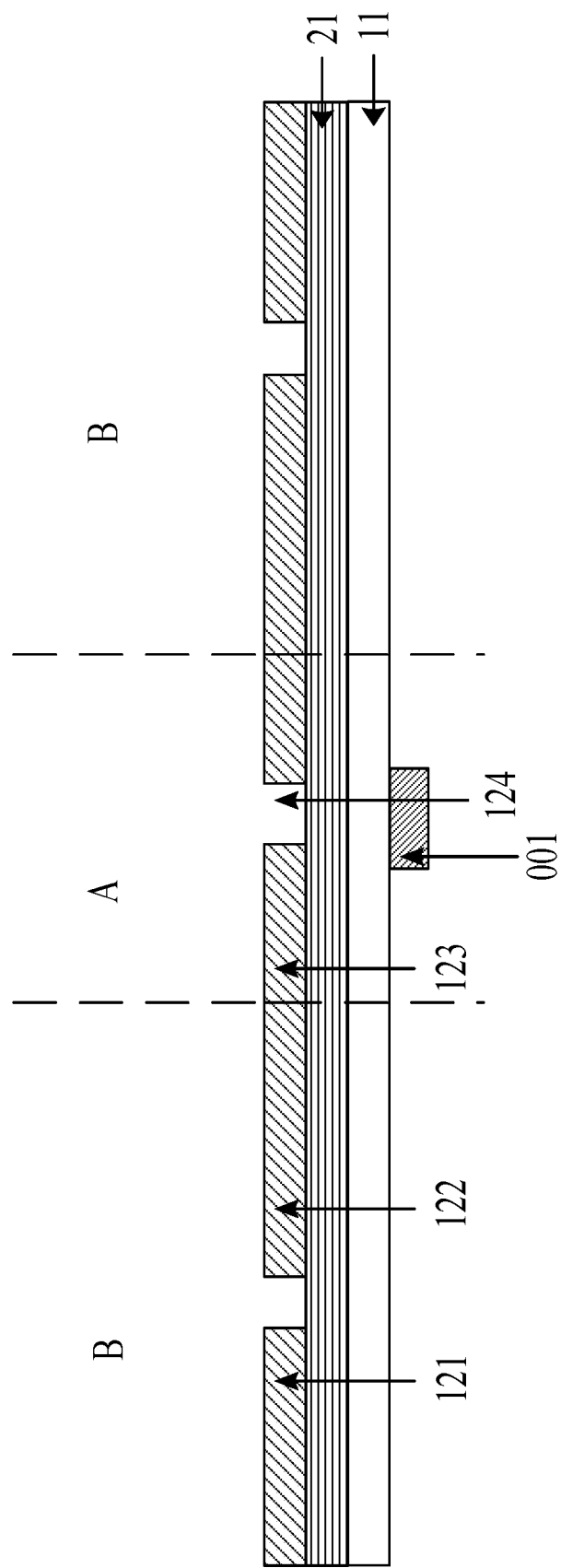
FIG. 8 is a schematic diagram of another base substrate formed with a conductive layer according to an embodiment of the present disclosure.

Optionally, a PI film 21 may be firstly formed on the base substrate 11, and then the conductive layer 12 is formed at the side of the PI film 21 away from the base substrate 11. The schematic diagram of the base substrate 11 on which the conductive layer 12 is formed may be made reference to FIG. 8.

In step 302, an intermediate insulating layer is formed on a side of the conductive layer away from the base substrate.

In the embodiment of the present disclosure, the intermediate insulating layer 13 may be formed on the side of the conductive layer 12 away from the base substrate 11 by a plurality of patterning processes. Optionally, as shown in FIG. 9, the first via-hole 131 and the second via-hole 132 are formed in the portion of the intermediate insulating layer 13 in the non-display area B.

Figure 9:
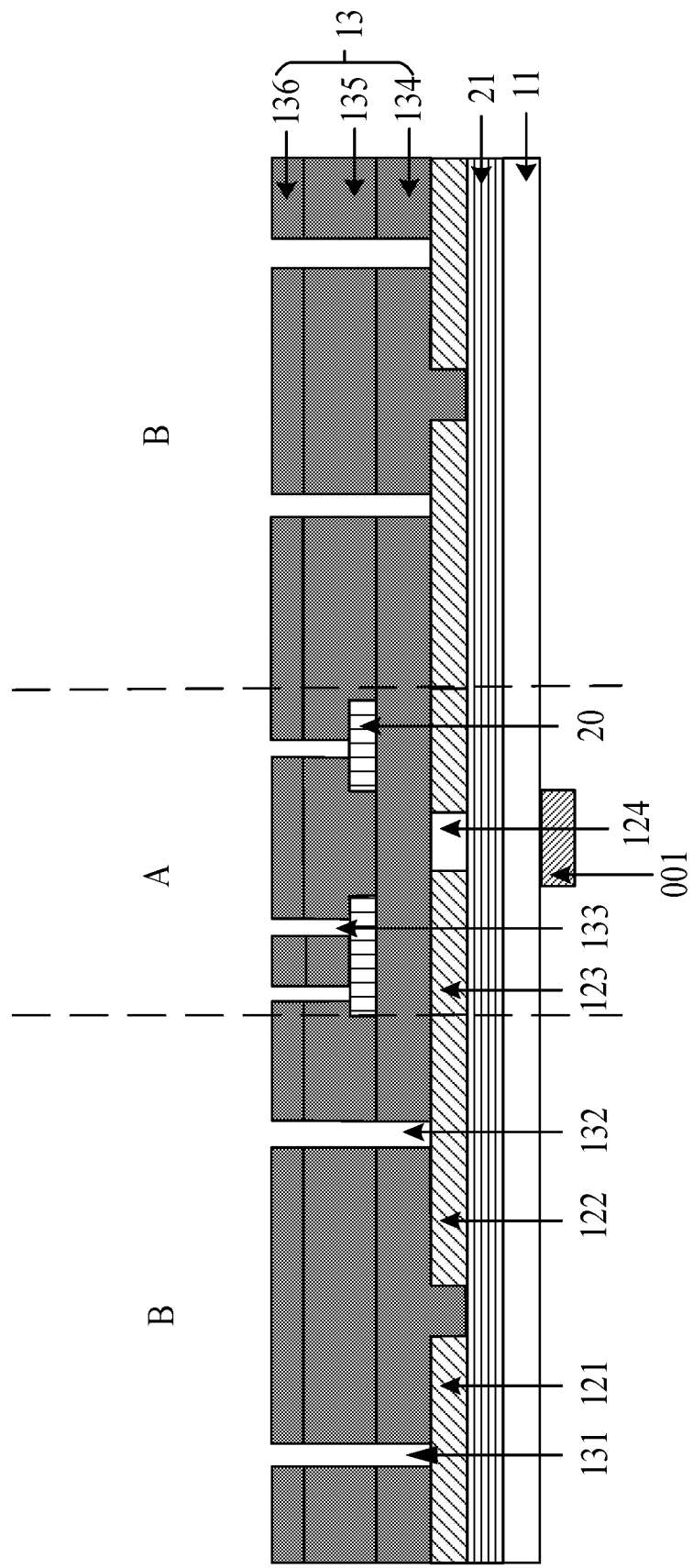
FIG. 9 is a schematic diagram of another base substrate formed with an intermediate insulating layer according to an embodiment of the present disclosure.

Optionally, referring to FIG. 9, the intermediate insulating layer 13 may include a buffer layer 134, a gate insulating layer 135, and an interlayer dielectric layer 136 that are sequentially laminated. In the embodiment of the present disclosure, the buffer layer 134 may be firstly formed on the side of the conductive layer 12 away from the base substrate 11. Afterwards, the active layer 20 is formed on the side of the buffer layer 14 away from the base substrate 11. Then, the gate insulating layer 135 is formed on the side of the active layer away from the base substrate 11. Then, the gate metal layer (not shown in FIG. 9) is formed on the side of the gate insulating layer 135 away from the base substrate 11. Finally, the interlayer dielectric layer 136 is formed on the side of the gate metal layer away from the base substrate 11. Here, the material for forming the buffer layer 134 may be silicon oxide. The material for forming the active layer 20 may be p-type silicon (P-Si).

In step 303, a metal layer is formed on a side of the intermediate insulating layer away from the base substrate.

The metal layer 14 may be formed on the side of the intermediate insulating layer 13 away from the base substrate 11 by a patterning process.

Figure 10:
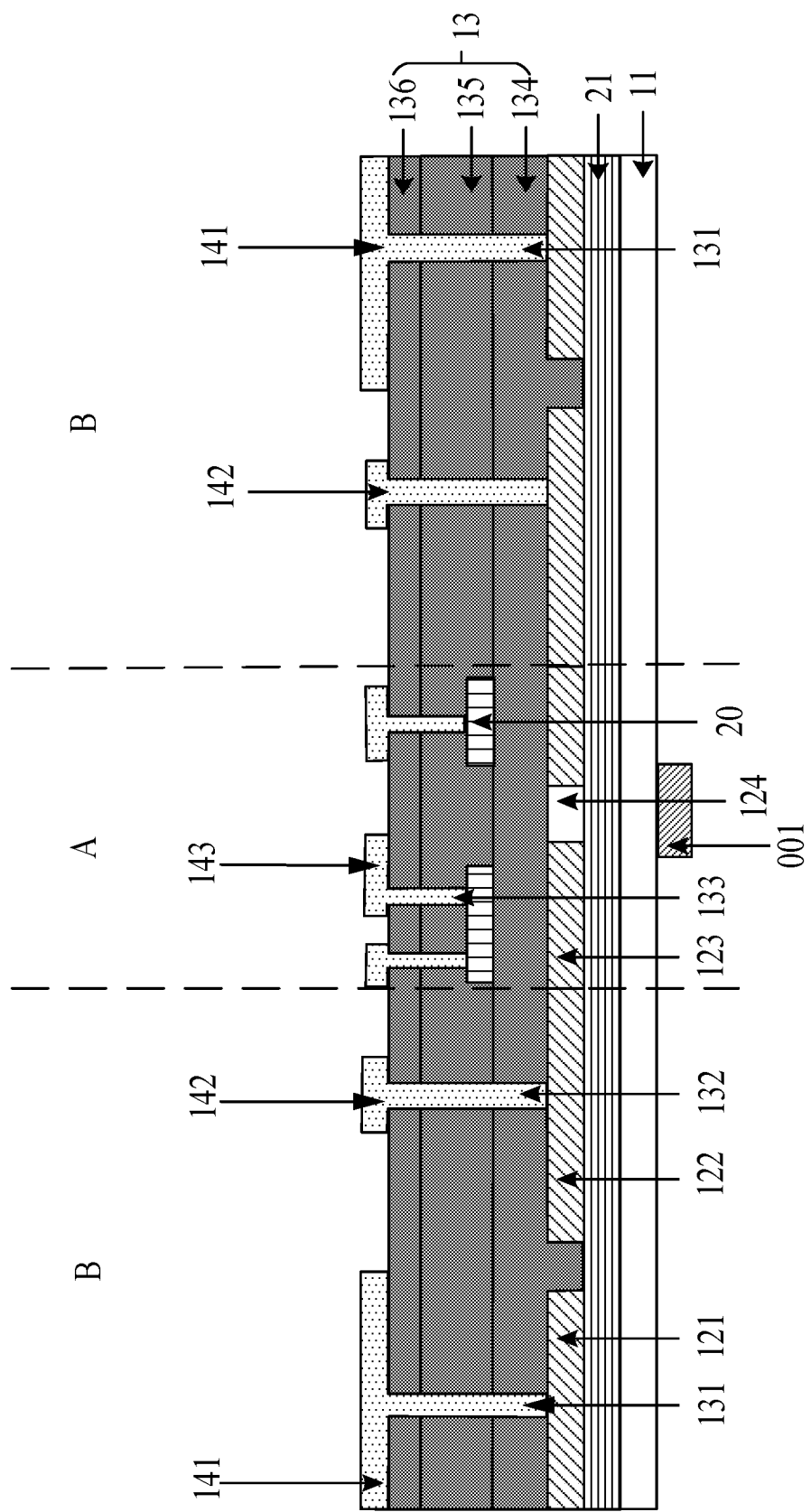
FIG. 10 is a schematic diagram of a base substrate formed with a metal layer according to an embodiment of the present disclosure.

The schematic diagram of the base substrate 11 on which the metal layer is formed may be made reference to FIG. 10. As shown in FIG. 10, a portion of the metal layer 14 in the non-display area B may include first signal lines 141 and second signal line 142s that are formed at an interval. The first signal line 141 is connected to the first conductive pattern 121 through the first via-hole 131, and the second signal line 142 is connected to the second conductive pattern 122 through the second via-hole 132. The first signal line 141 is connected to the first conductive pattern 121 in the conductive layer through the first via-hole 131, the second signal line 142 is connected to the second conductive pattern 122 in the conductive layer through the second via-hole 132, and the conductive layer 12 is made of a conductive material. Thus, each signal line is connected to a conductive structure in parallel, which reduces the resistance of the signal line, and correspondingly, improves the display effect of the display device.

In the embodiment of the present disclosure, referring to FIG. 10, the metal layer 14 may further include a plurality of source/drain metal patterns 143 in the display area A. In the embodiment of the present disclosure, the first signal line 114 and the second signal line 142 may be formed at the same layer as the source/drain metal patterns 143. That is, they can be formed by one patterning process, which simplifies the manufacturing process.

In step 304, a flat layer is formed on a side of the metal layer away from the base substrate.

Figure 11:
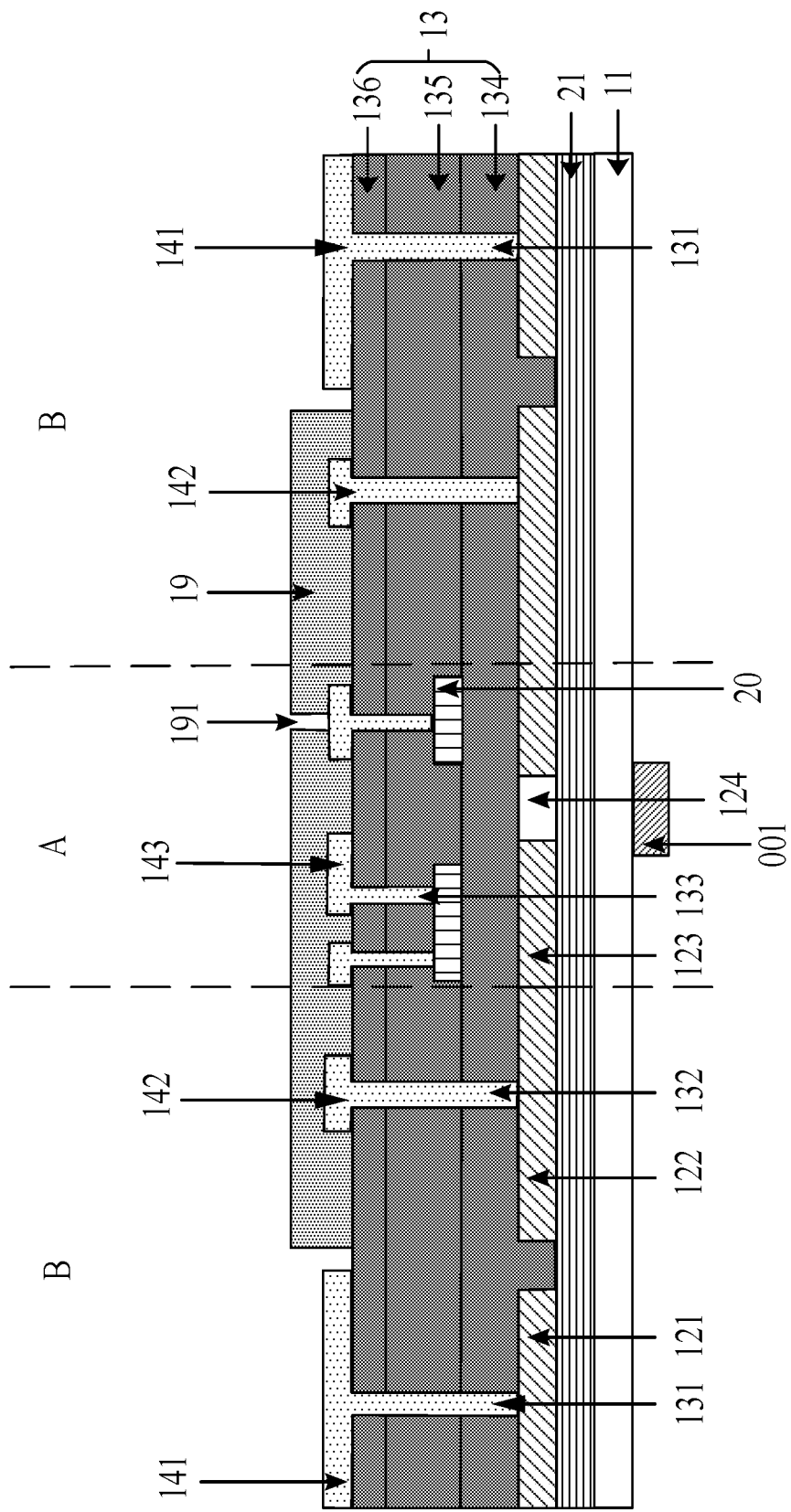
FIG. 11 is a schematic diagram of a base substrate formed with a flat layer according to an embodiment of the present disclosure.

The flat layer 19 may be formed on the side of the metal layer 14 away from the base substrate 11 by a patterning process. The orthographic projection of the flat layer 19 on the base substrate 11 does not overlap with the orthographic projection of the first signal line 141 on the base substrate 11. Optionally, the material for forming the flat layer 19 may be resin. The schematic diagram of the base substrate 11 on which the flat layer 19 is formed may be made reference to FIG. 11.

In step 305, a first electrode layer is formed on a side of the flat layer away from the base substrate.

Figure 12:
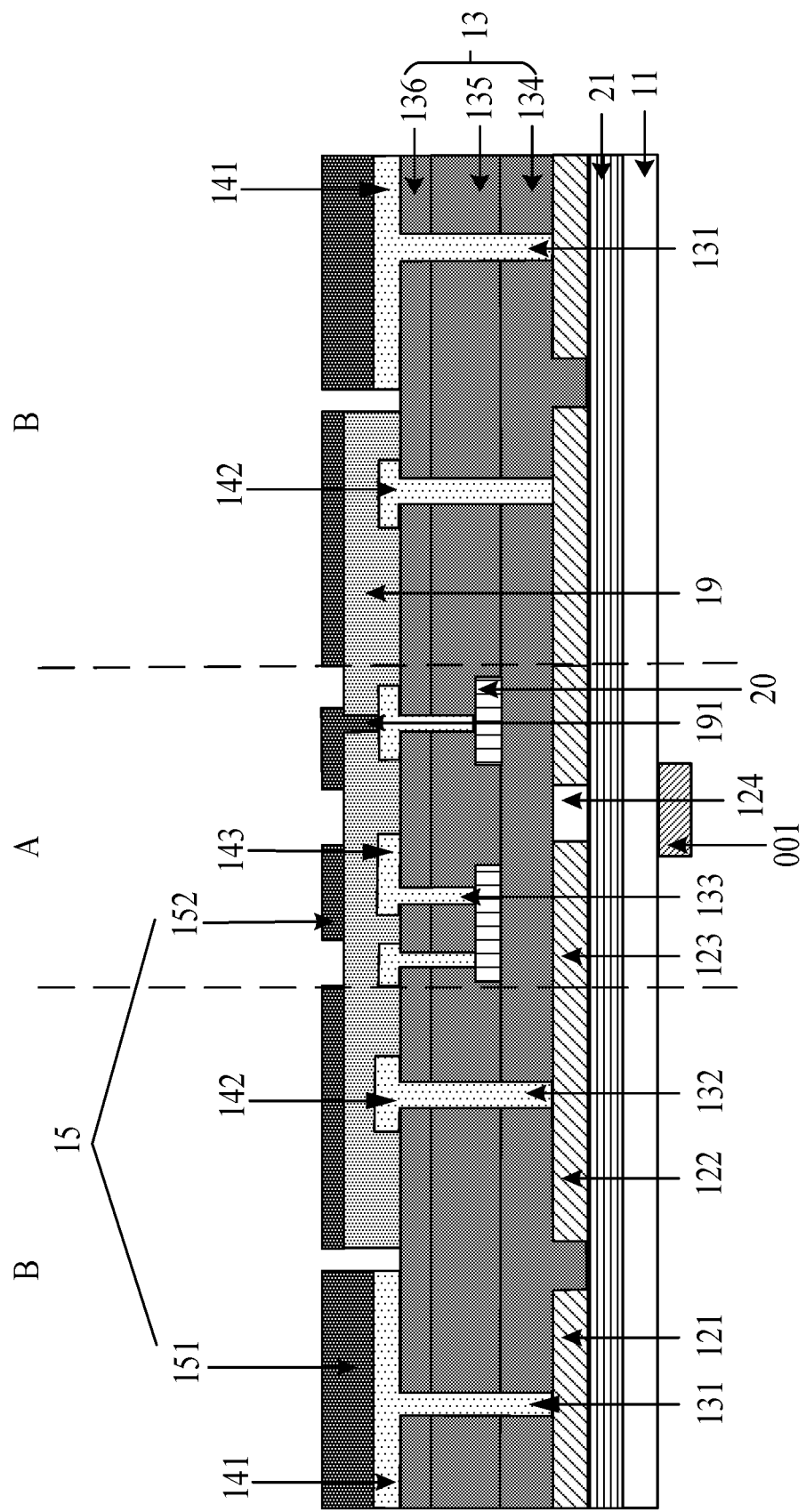
FIG. 12 is a schematic diagram of a base substrate formed with a first electrode layer according to an embodiment of the present disclosure.
Figure 13:
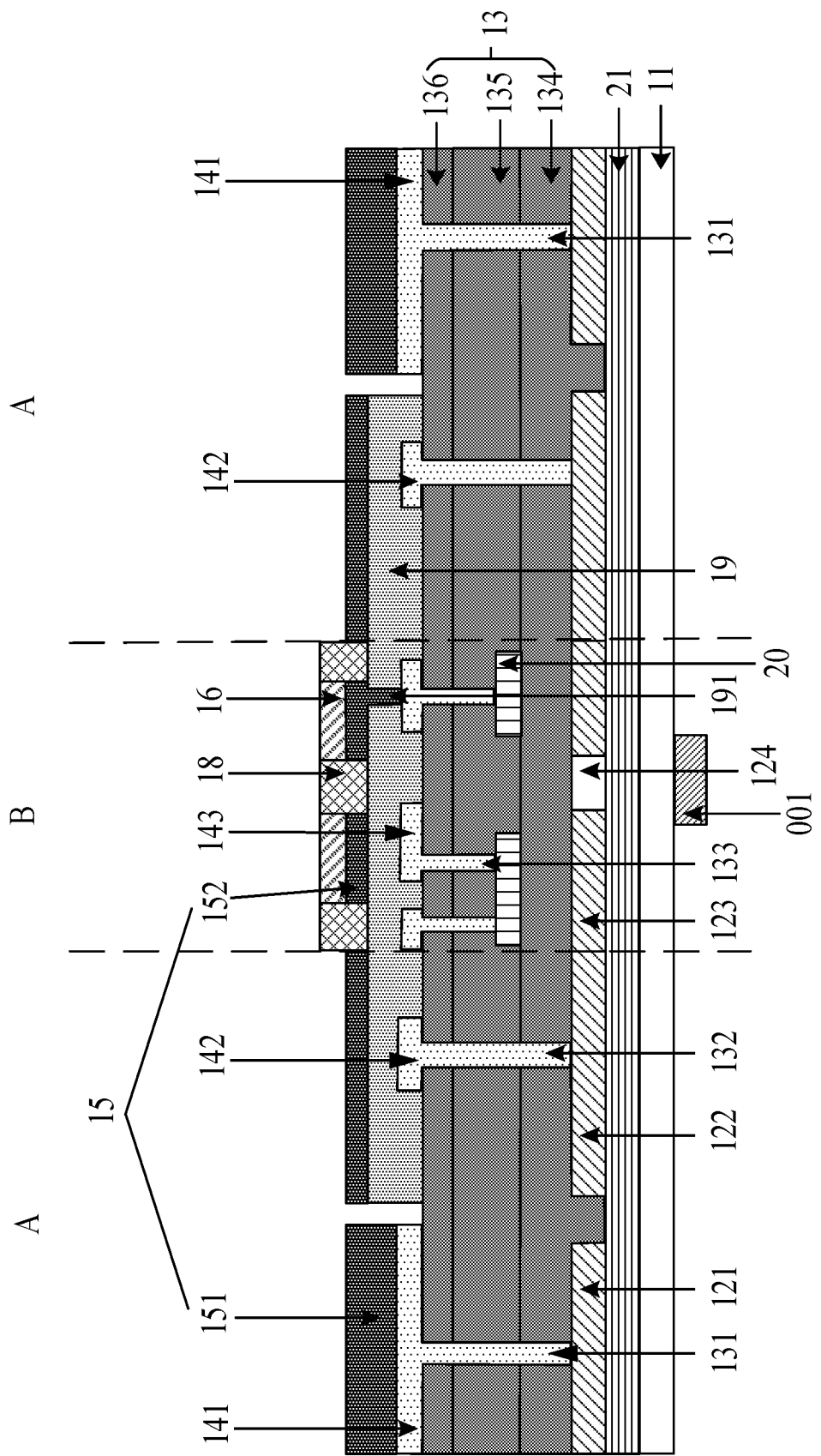
FIG. 13 is a schematic diagram of a base substrate formed with a light-emitting layer according to an embodiment of the present disclosure.

The first electrode layer 15 may be formed on the side of the flat layer 19 away from the base substrate 11 by a patterning process. The schematic diagram of the base substrate 11 on which the first electrode layer 15 is formed may be made reference to FIG. 12. As shown in FIG. 12, the first electrode layer 15 may include an overlapping electrode 151 that is in the non-display area B and in contact with the first signal line 141, and a plurality of first electrode blocks 152 formed at an interval in the display area A. The first electrode blocks 152 are formed at a side of the flat layer 19 away from the base substrate 11. Here, the material for forming the overlapping electrode 151 and the plurality of first electrodes 152 may be ITO.

The first electrode block 152 may be an anode, and the plurality of first electrode blocks 152 may be connected to the source/drain metal pattern 143 by the third via-hole 191 in the flat layer 19. Thus, the second signal line 142 may transmit the power source signal at a high level to the corresponding first electrode block 152 by the source/drain metal patterns 143.

In step 306, a light-emitting layer in the display area is formed on a side of the first electrode layer away from the base substrate.

A pixel defining layer 18 may be firstly formed on the side of the first electrode layer 15 away from the base substrate 11. Then, the light-emitting layer 16 in the display area A is formed by vapor deposition on the side of the pixel defining layer 18 away from the base substrate 11. The light-emitting layer 16 may include a plurality of light-emitting patterns that are formed at an interval. The plurality of light-emitting patterns is formed in an area defined by the pixel defining layer 18. The plurality of light-emitting patterns may include red light-emitting patterns, green light-emitting patterns, and blue light-emitting patterns.

In step 307, a second electrode layer that covers the display area and the non-display area and is in contact with the overlapping electrode is formed on a side of the light-emitting layer away from the base substrate.

Optionally, a mask plate may be adopted to perform vapor deposition on the side of the light-emitting layer 16 away from the base substrate 11, to form the second electrode layer 17. Each of the first electrode blocks 152 in the first electrode layer 15, the light-emitting pattern, in contact with the first electrode blocks 152, in the light-emitting layer 16, and the second electrode layer 17 may form a light-emitting unit. Here, the second electrode layer 17 may be a sheet electrode. That is, the plurality of the light-emitting units may share the second electrode layer 17.

In the embodiment of the present disclosure, the first signal line 141 may transmit the power source signals at a low level to the second electrode layer 17 through the overlapping electrode 151 in the first electrode layer 15, and the second signal line 142 may transmit the power source signals at a high level to each of the first electrode blocks 152 through the source/drain metal patterns 143 in the display area B. The second electrode layer 17 can drive the light-emitting patterns to emit light together with each of the first electrode blocks 152. The schematic diagram of the base substrate 11 on which the second electrode layer 17 is formed may be made reference to FIG. 2.

Referring to FIG. 2, it can be seen that the orthographic projection of each through-hole 124 on the base substrate 11 does not overlap with the orthographic projection of each of the light-emitting units 002 on the base substrate 11, to ensure the optical sensor 001 to be normally photosensitive.

In summary, the embodiment of the present disclosure provides a method for manufacturing a display substrate. A conductive layer, an intermediate insulating layer and a metal layer that are sequentially laminated are formed on the base substrate with a conductive material. The first signal line in the metal layer may be connected to the first conductive pattern in the conductive layer through the first via-hole in the intermediate insulating layer, and the second signal line in the metal layer may be connected to the second conductive pattern in the conductive layer through the second via-hole in the intermediate insulating layer. Thus, each of the signal line is connected to a conductive structure in parallel, which reduces the resistance of the signal line, and correspondingly, improves the display effect of the display device.

An embodiment of the present disclosure provides a display device, and the display device includes the display substrate as shown in FIG. 1 or FIG. 2. The display device may be any product or part having a display function, such as a piece of electronic paper, a mobile phone, a tablet computer, a TV, a display, a laptop computer, a digital photo frame, a navigator etc.

The foregoing descriptions are merely exemplary embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A display substrate, comprising: a base substrate, and a conductive layer, an intermediate insulating layer, and a metal layer that are sequentially laminated on the base substrate; wherein
the conductive layer comprises a first conductive pattern and a second conductive pattern at an interval;
the intermediate insulating layer has a first via-hole and a second via-hole; and
the metal layer comprises a first signal line and a second signal line at an interval, wherein the first signal line is connected to the first conductive pattern through the first via-hole, and the second signal line is connected to the second conductive pattern through the second via-hole; and
wherein the display substrate comprises a display area and a non-display area;
the first signal line is in the non-display area, and the display substrate further comprises an overlapping electrode on a side of the metal layer away from the base substrate; and
the overlapping electrode is in the non-display area and is disposed in a same layer as a first electrode block in a light-emitting unit of the display substrate; and the overlapping electrode is in contact with the first signal line and a second electrode layer of the light-emitting unit, respectively.

2. The display substrate according to claim 1, wherein the first conductive pattern, the second conductive pattern, the first via-hole, the second via-hole, the first signal line, and the second signal line are all in the non-display area.

3. The display substrate according to claim 2, wherein the conductive layer further comprises a third conductive pattern in the display area, and the third conductive pattern and the second conductive pattern are an integral structure.

4. The display substrate according to claim 1, wherein the conductive layer is a light-shielding layer made of a conductive and light-shielding material, and the conductive layer, the intermediate insulating layer and the metal layer are sequentially laminated in a direction away from the base substrate.

5. The display substrate according to claim 4, further comprising: at least one optical sensor on a side of the base substrate away from the conductive layer, wherein
the conductive layer has at least one through-hole, and an orthographic projection of each through-hole on the base substrate overlaps with an orthographic projection of one optical sensor on the base substrate.

6. The display substrate according to claim 5, further comprising: a plurality of light-emitting units on a side of the metal layer away from the base substrate, wherein
the plurality of light-emitting units, the at least one optical sensor, and the at least one through-holes are all in the display area of the display substrate, and the orthographic projection of each through-hole on the base substrate does not overlap with an orthographic projection of each light-emitting unit on the base substrate.

7. The display substrate according to claim 1, further comprising: a flat layer between the metal layer and the light-emitting unit; wherein
an orthographic projection of the flat layer on the base substrate does not overlap with an orthographic projection of the first signal line on the base substrate.

8. The display substrate according to claim 1, wherein the intermediate insulating layer has a plurality of the first via-holes and a plurality of the second via-holes;
the first signal line is connected to the first conductive pattern through the plurality of the first via-holes; and
the second signal line is connected to the second conductive pattern through the plurality of the second via-holes.

9. The display substrate according to claim 1, wherein the metal layer comprises two first signal lines that are disposed facing each other on two sides of the display area of the display substrate.

10. The display substrate according to claim 1, wherein the metal layer further comprises a plurality of source/drain metal patterns in the display area of the display substrate.

11. The display substrate according to claim 1, wherein the second conductive pattern is an annular pattern surrounding the display area of the display substrate, and the first conductive pattern is a strip pattern and the first conductive pattern is on a side of the second conductive pattern away from the display area.

12. The display substrate according to claim 6, wherein the first signal line and the second signal line are both in the non-display area; the metal layer further comprises: a plurality of source/drain metal patterns in the display area; and the display substrate further comprises: a flat layer between the metal layer and the light-emitting unit, and an overlapping electrode disposed in a same layer as a first electrode block in the light-emitting unit and in the non-display area;
an orthographic projection of the flat layer on the base substrate does not overlap with an orthographic projection of the first signal line on the base substrate;
the overlapping electrode is in contact with the first signal line and a second electrode layer in the light-emitting unit, respectively; and
a portion, in the non-display area, of the intermediate insulating layer has a plurality of the first via-holes and a plurality of the second via-holes, the first signal line is connected to the first conductive pattern through the plurality of via-holes, and the second signal line is connected to the second conductive pattern through the plurality of second via-holes.

13. A method for manufacturing a display substrate, comprising:
forming a conductive layer on a base substrate with a conductive material, wherein the conductive layer comprises a first conductive pattern and a second conductive pattern that are formed at an interval;
forming an intermediate insulating layer on the base substrate, wherein a first via-hole and a second via-hole are formed in the intermediate insulating layer; and
forming a metal layer on the base substrate, wherein the metal layer comprises a first signal line and a second signal line that are formed at an interval, wherein the first signal line is connected to the first conductive pattern through the first via-hole, and the second signal line is connected to the second conductive pattern through the second via-hole; and
wherein the display substrate comprises a display area and a non-display area;
the first signal line is in the non-display area, and the display substrate further comprises an overlapping electrode on a side of the metal layer away from the base substrate; and
the overlapping electrode is in the non-display area and is disposed in a same layer as a first electrode block in a light-emitting unit of the display substrate; and the overlapping electrode is in contact with the first signal line and a second electrode layer of the light-emitting unit, respectively.

14. The method according to claim 13, wherein the first conductive pattern, the second conductive pattern, the first via-hole, the second via-hole, the first signal line, and the second signal line are all in the non-display area.

15. The method according to claim 13, wherein forming the conductive layer on the base substrate with the conductive material comprises:
   forming a conductive layer on the base substrate with a conductive and light-shielding material;
   wherein the conductive layer, the intermediate insulating layer and the metal layer are sequentially laminated in a direction away from the base substrate.

16. The method according to claim 15, wherein the conductive layer has at least one through-hole, and the method further comprises:
   disposing at least one optical sensor on a side of the base substrate away from the conductive layer;
   wherein an orthographic projection of each through-hole on the base substrate overlaps with an orthographic projection of one optical sensor on the base substrate.

17. The method according to claim 13, wherein the first signal line is in the non-display area, and the method further comprises:
   forming a first electrode layer on a side of the metal layer away from the base substrate, wherein the first electrode layer comprises an overlapping electrode that is in the non-display area and in contact with the first signal line, and a plurality of first electrode blocks that are formed at an interval in the display area;
   forming a light-emitting layer in the display area on a side of the first electrode layer away from the base substrate; and
   forming a second electrode layer that covers the display area and the non-display area and is contact with the overlapping electrode, on a side of the light-emitting layer away from the base substrate.

18. The method according to claim 17, wherein prior to forming the first electrode layer on a side of the metal layer away from the base substrate, the method further comprises:
   forming a flat layer on a side of the metal layer away from the base substrate, wherein an orthographic projection of the flat layer on the base substrate does not overlap with an orthographic projection of the first signal line on the base substrate.

19. A display device, comprising a display substrate that comprises a base substrate, and a conductive layer, an intermediate insulating layer, and a metal layer that are sequentially laminated; wherein
   the conductive layer comprises a first conductive pattern and a second conductive pattern at an interval;
   the intermediate insulating layer has a first via-hole and a second via-hole; and
   the metal layer comprises a first signal line and a second signal line at an interval, wherein the first signal line is connected to the first conductive pattern through the first via-hole, and the second signal line is connected to the second conductive pattern through the second via-hole; and
   wherein the display substrate comprises a display area and a non-display area;
   the first signal line is in the non-display area, and the display substrate further comprises an overlapping electrode on a side of the metal layer away from the base substrate; and
   the overlapping electrode is in the non-display area and is disposed in a same layer as a first electrode block in a light-emitting unit of the display substrate; and the overlapping electrode is in contact with the first signal line and a second electrode layer of the light-emitting unit, respectively.

\* \* \* \* \*